United States Patent
Chang

(10) Patent No.: US 9,520,204 B2
(45) Date of Patent: Dec. 13, 2016

(54) COLD STRIPPER FOR HIGH ENERGY ION IMPLANTER WITH TANDEM ACCELERATOR

(71) Applicant: Varian Semiconductor Equipment Associates, Inc., Gloucester, MA (US)

(72) Inventor: Shengwu Chang, South Hamilton, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 294 days.

(21) Appl. No.: 14/140,893

(22) Filed: Dec. 26, 2013

(65) Prior Publication Data

US 2015/0187450 A1    Jul. 2, 2015

(51) Int. Cl.
| | | |
|---|---|---|
| H01J 23/00 | (2006.01) | |
| G21K 1/14 | (2006.01) | |
| H05H 5/06 | (2006.01) | |
| H01J 37/317 | (2006.01) | |
| H01L 21/265 | (2006.01) | |
| H05H 7/08 | (2006.01) | |

(52) U.S. Cl.
CPC ............. *G21K 1/14* (2013.01); *H01J 37/3171* (2013.01); *H05H 5/063* (2013.01); *H01J 2237/002* (2013.01); *H01J 2237/061* (2013.01); *H01J 2237/082* (2013.01); *H01L 21/265* (2013.01); *H05H 2007/088* (2013.01)

(58) Field of Classification Search
CPC ................ H01J 2237/082; H01J 2237/31701; H01J 2237/061; H01J 2237/002; H01J 37/3171; H01J 37/08; C23C 14/48; H01L 21/265

USPC .... 315/500–507; 250/282, 492.21, 281, 398, 250/492.2, 492.3

See application file for complete search history.

(56) References Cited

U.S. PATENT DOCUMENTS

| | | | | |
|---|---|---|---|---|
| 5,670,785 | A * | 9/1997 | Kitamura | .............. H01J 27/028 250/423 R |
| 7,498,588 | B1 * | 3/2009 | Gordon | .................... H05H 5/06 315/500 |
| 7,498,988 | B2 * | 3/2009 | Bisiules | ................. H01Q 1/246 343/700 MS |
| 2002/0171049 | A1 | 11/2002 | Kwon | |
| 2006/0292058 | A1 * | 12/2006 | Reden | ................. H01J 37/3171 423/447.2 |
| 2011/0101213 | A1 | 5/2011 | Satoh | |
| 2012/0252195 | A1 * | 10/2012 | Jones | ................. H01J 37/3171 438/514 |

OTHER PUBLICATIONS

International Search Report and Written Opinion Mailed Mar. 30, 2015 for PCT/US2014/069671 Filed Dec. 11, 2014.

* cited by examiner

*Primary Examiner* — Thai Pham
*Assistant Examiner* — Borna Alaeddini

(57) ABSTRACT

A cold stripper for a high-energy ion implanter system is provided. The cold stripper including a stripper tube having a hollow cavity, a first aperture in the stripper tube to admit an ion beam of positively charged ions into the hollow cavity and a second aperture in the stripper tube to discharge the ion beam from the hollow cavity, a gas pump coupled to the hollow cavity to introduce a gas into the hollow cavity, one or more cooling passages in the stripper tube, and a coolant pump coupled to the one or more cooling passages to circulate a coolant through the one or more cooling passages.

19 Claims, 4 Drawing Sheets

COLD STRIPPER FOR HIGH ENERGY ION IMPLANTER WITH TANDEM ACCELERATOR

FIELD

The present embodiments relate to high-energy ion implanters, and more particularly, to tandem accelerators used in high energy ion implanters.

BACKGROUND

Ion implanters are widely used in electronic device fabrication, including semiconductor manufacturing to control device properties. In a typical ion implanter, ions generated from an ion source are directed as an ion beam through a series of beam-line components that may include an analyzing magnet and a plurality of electrodes that provide electric fields to tailor the ion beam properties. The analyzing magnet selects desired ion species, and filters out contaminant species and ions having undesirable energies. Suitably shaped electrodes may modify the energy and the shape of an ion beam.

For high-energy ion implantation, typically 100 keV or greater, tandem acceleration is often used to accelerate ions to a desired high energy. A tandem accelerator may be disposed along the beam line of an ion implanter in order to generate sufficiently high energy to implant ions into a substrate at desired depths. In a tandem acceleration process, an electrostatic accelerator accelerates negative ions generated in a special ion source from ground potential up to a positive high-voltage terminal. The electrons on the negative ions are then stripped by passage through a charge exchange region (referred to as a "stripper"). The resulting positive ions are again accelerated as they pass to ground potential from the high negative potential. The ions emerge from the tandem accelerator with twice the energy of the high positive voltage applied to the tandem accelerator.

One problem with producing high-energy ion beams using a tandem accelerator is energy contamination may result from the stripping process. This energy contamination may reduce the yield of manufactured devices. More specifically, energy contamination may reduce the overall energy of the ion beam. As such, the depth with which the ions are implanted may be less than desired or may be unpredictable due to the energy contamination. This is particularly important as the complexity of the devices manufactured using ion implantation grows and as the physical size of the devices manufactured shrinks. As will be appreciated, as the device complexity grows and the physical size shrinks, the manufacturing process is more sensitive to energy contamination, which has a strong correlation to device yield. It is with respect to these and other considerations that the present improvements have been needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, a cold stripper to strip electrons from ions in an ion beam is provided. The cold stripper may include a stripper tube having a hollow cavity, a first aperture in the stripper tube to admit an ion beam of negatively charged ions into the hollow cavity and a second aperture in the stripper tube to discharge the ion beam from the hollow cavity, a gas pump coupled to the hollow cavity to introduce a gas into the hollow cavity, one or more cooling passages in the stripper tube, and a coolant pump coupled to the one or more cooling passages to circulate a coolant through the one or more cooling passages.

In one embodiment, a high-energy ion implanter system is provided. The high-energy ion implanter system including an ion source to generate an ion beam, a tandem accelerator to accelerate ions in the ion beam to increase the energy of the ion beam, the tandem accelerator including a low-energy accelerator tube, a cold stripper, and a high-energy accelerator tube, the cold stripper including a stripper tube including a hollow cavity, a first aperture in the stripper tube to admit an ion beam of negatively charged ions into the hollow cavity and a second aperture in the stripper tube to discharge the ion beam from the hollow cavity, a gas pump coupled to the hollow cavity to introduce a gas into the hollow cavity, one or more cooling passages in the stripper tube, a coolant pump coupled to the one or more cooling passages to circulate a coolant through the one or more cooling passages and a platen to support a workpiece in the trajectory of the ion beam.

In one embodiment, a method of generating a high-energy ion beam is provided. The method including admitting an ion beam into a hollow cavity in a stripper tube, introducing a gas into the hollow cavity, circulating a coolant through one or more cooling passages in the stripper tube, measuring a pressure in the hollow cavity, and adjusting a flow rate of the coolant through the one or more cooling passages to maintain the pressure between a range of pressures.

DETAILED DESCRIPTION

Figure 1:
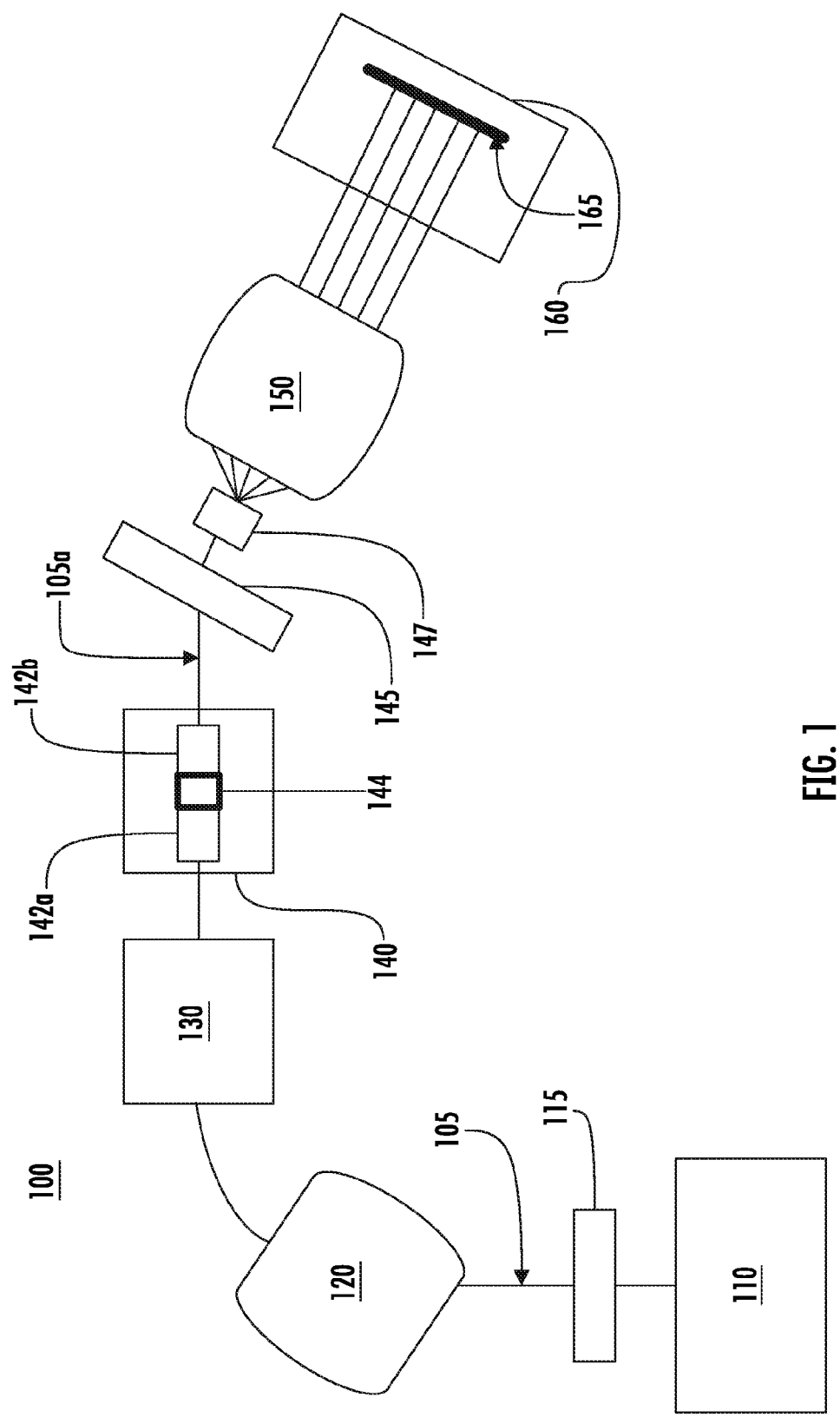
FIG. 1 depicts a block diagram of a high-energy ion implanter system incorporating a tandem accelerator including a cold stripper.

The present embodiments will now be described more fully hereinafter with reference to the accompanying drawings, in which some embodiments are shown. The subject matter of the present disclosure, however, may be embodied in many different forms and should not be construed as limited to the embodiments set forth herein. Rather, these embodiments are provided so that this disclosure will be thorough and complete, and will fully convey the scope of the subject matter to those skilled in the art. In the drawings, like numbers refer to like elements throughout.

Various embodiments described herein provide a cold stripper for a tandem accelerator. The tandem accelerator, including the cold stripper, may be used in a high-energy ion implanter system. Said differently, the tandem accelerator and cold stripper may be used to accelerate ions in an ion beam, thus increasing the energy of the ion beam. The increased energy ion beam may be suitable for implanting ions in a target substrate.

The exemplary cold strippers described herein may be actively cooled to reduce the temperature and pressure inside the stripper tube. In particular, a cold stripper described herein may be actively cooled to provide greater control over the temperature, pressure, and/or gas flow rates during the stripping process. As the temperature of the cold stripper is reduced due to the cooling, the pressure in the cold stripper will also be reduced proportionately. As such, less gas may be necessary to cause the electrons to be stripped from the ions in the ion beam. Furthermore, controlling the cooling of the cold stripper may allow more fine tuned control over the pressure inside the cold stripper. As such, the gas introduced into the cold stripper may be substantially contained within the cold stripper. As will be described herein, containing the gas within the cold stripper may reduce the amount of energy contamination resulting from the stripping process thereby positively impacting device yield.

FIG. 1 illustrates a block diagram of an exemplary high-energy ion implanter system 100. Although the high-energy ion implanter system 100 is shown having a limited number of elements in a certain topology, it may be appreciated that the high-energy ion implanter system 100 may include more or less elements in alternate topologies as desired for a given implementation. An ion source 110 is configured to generate ions of a particular species based on the introduction of a feed gas having desired dopant characteristics. The ion source 110 may have an indirectly heated cathode (IHC) where a filament is used to heat a cathode that supplies energetic electrons within the ion source. The feed gas introduced into the source is ionized into a plasma by exposing it to these energetic electrons and ion beam 105 is extracted from the ion source 110 through an extraction aperture by a biased extraction electrode assembly.

A charge exchanger 115 receives the ion beam 105 and creates a negative ion beam, which is supplied to mass analyzer magnet 120. In particular, after passing through the charge exchanger 115, the ion beam 105 will include negatively charged ions. The ion beam 105 including the negatively charged ions is passed through the mass analyzer magnet 120. The mass analyzer magnet 120 includes a resolving magnet, which functions to pass only ions having the desired mass and energy to a resolving aperture. In particular, mass analyzer magnet 120 includes a curved path where ion beam 105 is exposed to an applied magnetic field such that only the ions with a desired mass-to-charge ratio are able to travel through a mass resolving slit downstream of the mass analyzer.

The ion beam 105 is supplied to lens 130 which may include a quadrupole lens to focus the ion beam 105 for transmission through tandem accelerator 140. To this point, ion beam 105 is considered a low energy ion beam with energy in the range of a few keV to a few tens of keV. Tandem accelerator 140 receives the ion beam 105 (e.g., the low energy ion beam) and accelerates the ion beam 105 to energies in the range of several thousand keV (i.e. MeV), resulting in a high-energy ion beam 105a. Tandem accelerator 140 includes a low-energy accelerator tube 142a, a cold stripper 144 (described in greater detail below), and a high-energy accelerator tube 142b. In general, each of the low-energy accelerator tube 142a and the high-energy accelerator tube 142b contain a number of electrodes separated by insulating rings. A positive high voltage is applied by a high voltage power supply to a terminal (refer to FIG. 2) located on the end of the low-energy accelerator tube 142a and a terminal (refer to FIG. 2) located on the end of the high-energy accelerator tube 142b. The terminals are located on the ends adjacent to the cold stripper 144. The supplied positive high voltage is delivered from the terminals to the highest voltage electrodes of the low-energy accelerator tube 142a and the high-energy accelerator tube 142b. Adjacent electrodes are interconnected by high value resistors, which distribute the applied voltage among the electrodes. The other ends of the low-energy accelerator tube 142a and the end of the high-energy accelerator tube 142b are maintained at ground potential.

The cold stripper 144 is disposed between the low-energy accelerator tube 142a and the high-energy accelerator tube 142b. The cold stripper converts ions in the ion beam 105 from a negative charge to a positive charge by the introduction of a gas such as, for example, argon, in the path of the ion beam 105. During operation, the negatively charged ion beam 105 is injected into the tandem accelerator, accelerated through the low-energy accelerator tube 142a, converted to a positive ion beam in the cold stripper 144, and accelerated further in the high-energy accelerator tube 142b.

The cold stripper is configured to introduce a gas into the cold stripper. During operation, as the ion beam 105 passes through the cold stripper 144, the negatively charged ions collide with the particles in the gas and electrons are "stripped" from the negatively charged ions changing the ions to positively charged ions. As will be described in greater detail below, the cold stripper 144 is actively cooled to reduce a temperature of the cold stripper 144. As such, the pressure inside (e.g., where the ions in the ion beam 105 collide with the gas particles) the cold stripper 144 may be reduced proportionately. The cold stripper 144 may be configured to control the temperature of the cold stripper and the flow of gas introduced into the cold stripper to maintain an optimal pressure inside the cold stripper 144.

Once the high-energy ion beam 105a exits the tandem accelerator 140, it may be supplied to filter 145. The filter 145 may be a magnet that filters away the ions with undesired mass or energy from the high-energy ion beam 105a. A scanner 147 scans the ion beam back and forth in a scan plane. A collimator 150, which includes a collimator magnet, is positioned downstream of the scanner 147 and is energized to deflect ion beamlets of the high-energy ion beam 105a in accordance with the strength and direction of an applied magnetic field to collimate the diverging beam and direct it towards an end station 160. The collimator magnet 150 is provided to ensure that the high-energy ion beam 105a is incident on a target substrate supported by platen 165 within end station 160 at a constant angle across the surface of the substrate. The ions lose energy when they collide with electrons and nuclei in the target substrate and come to rest at a desired depth within the substrate based on the acceleration energy. The end station 160 may support one or more substrates on platen 165 in the path of high-energy ion beam 105a. The end station 160 may also include additional components known to those skilled in the art. For example, end station 160 may typically include automated handling equipment for introducing target substrates into a processing chamber and for removing such substrates after ion implantation.

Figure 2:
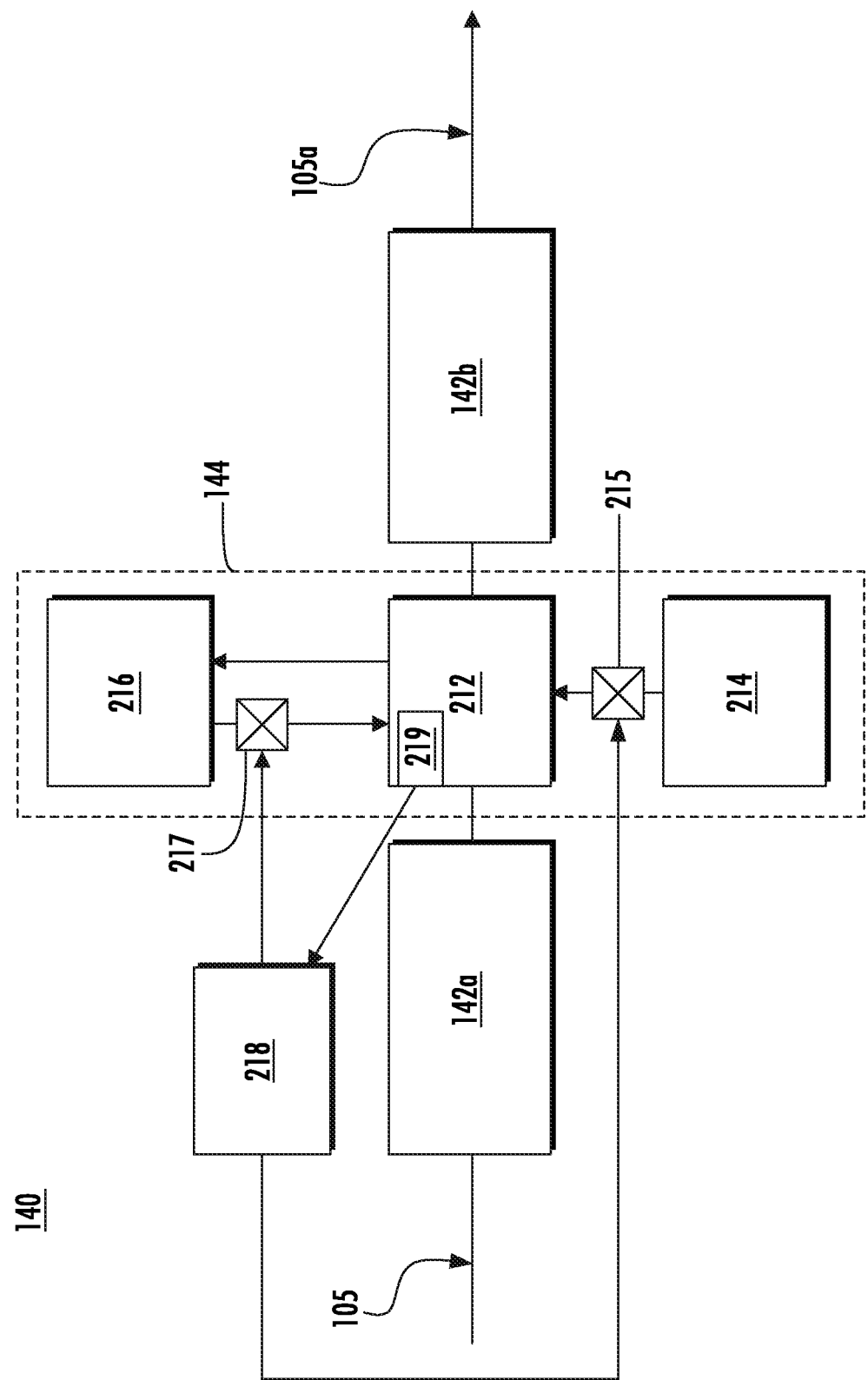
FIG. 2 depicts a block diagram of a tandem accelerator including a cold stripper.

FIG. 2 illustrates a block diagram of an exemplary embodiment of tandem accelerator 140 shown in FIG. 1. It is to be appreciated, that although the tandem accelerator 140 depicted in FIG. 2 is described with reference to the high-energy ion implanter system 100, this is not intended to be limiting. For example, the tandem accelerator 140 may be implemented in a high-energy ion implanter having an alternative configuration to that depicted in FIG. 1.

Turning more specifically to FIG. 2, the tandem accelerator 140 includes the low-energy accelerator tube 142a, the cold stripper 144, and the high-energy accelerator tube 142b. The cold stripper 144 may include a stripper tube 212, a gas source 214, a gas pump 215, a coolant source 216, and a coolant pump 217. As depicted, the stripper tube 212 is disposed between the low-energy accelerator tube 142a and the high-energy accelerator tube 142b. As such, during operation, the ion beam 105 may be transmitted through the low-energy accelerator tube 142a, the stripper tube 212, and the high-energy accelerator tube 142b to increase the energy of the ion beam, resulting in the high-energy ion beam 105a.

As described above, each of the low-energy accelerator tube 142a and the high-energy accelerator tube 142b include a ground terminal and a positive terminal to form a voltage potential between the ends of each tube. More specifically, the low-energy accelerator tube 142a is shown including ground terminal 202a and positive voltage terminal 204a. Similarly, the high-energy accelerator tube 142b is shown including ground terminal 202b and positive voltage terminal 204b. Accordingly, during operation, voltage may be applied to the positive voltage terminal 204a and the positive voltage terminal 204b. As such, due to the voltage potential between the ends of the low-energy accelerator tube 142a, the negatively charged ions in the ion beam 105 will be accelerated towards the cold stripper tube 212 as they pass through the low-energy accelerator tube 142a. The ion beam 105 may enter the stripper tube 212 of the cold stripper 144 and the negatively charged ions in the ion beam 105 may be converted to positively charged ions. The ion beam 105 including the positively charged ions may then enter the high-energy accelerator tube 142b and be accelerated again due to the voltage potential between the ends of the high-energy accelerator tube 142b resulting in the high-energy ion beam 105a.

The gas pump 215 introduces a gas such as, for example, argon into the stripper tube 212. As the ion beam 105 passes through the stripper tube 212, the ions collide with the Argon gas particles and electrons are "stripped" from the ions resulting in positively charged ions. The coolant pump 217 circulates a coolant through coolant passages (refer to FIG. 3) in the stripper tube 212. In some examples, the coolant may be de-ionized water, liquid nitrogen, liquid helium or other suitable coolant.

During operation, the coolant pump 217 circulates coolant through coolant passages in the stripper tube 212 to cool the stripper tube 212 in order to reduce the temperature inside the stripper tube 212. Without actively cooling the stripper tube, the temperature therein could reach approximately 900° C. The stripper tube 212 is actively cooled (e.g., by circulating coolant) such that the temperature in the stripper tube 212 is reduced where the ions from the ion beam 105 are colliding with the particles from the Argon gas. With cooling, the temperature of the stripper tube 212 may be at a value between −250° C. and 100° C. For example, if de-ionized water is used as the coolant, the temperature of the stripper tube 212 may be maintained at about 20° C. and at worst at about 100° C. depending on various factors such as, for example flow rate, type of gas used in the stripper, etc. If liquid nitrogen is used as the coolant, the temperature of the stripper tube 212 may be maintained at approximately −190° C. By way of another example, if liquid helium is used as the coolant, the temperature of the stripper tube 212 may be maintained at approximately −250° C. As the temperature within the stripper tube 212 is reduced, the pressure within the stripper tube 212 will also be reduced, typically in a proportional amount.

The present disclosure provides that the pressure within the stripper tube 212 be reduced in order to mitigate the amount of gas that leaks out from the ends of the stripper tube 212. It is to be appreciated, that as gas particles leak out from the ends of the stripper tube 212, they may enter into the low-energy accelerator tube 142a and/or the high-energy accelerator tube 142b. As a result, ions from the ion beam 105 may collide with the gas particles inside the low-energy accelerator tube 142a and/or the high-energy accelerator tube 142b resulting in "energy contamination." It is to be appreciated, that when the ions from the ion beam 105 collide with the gas particles, a secondary ion (e.g., an ion having less electrons) is created. When these secondary ions are created inside an accelerator tube (e.g., either the low-energy accelerator tube 142a and/or the high-energy accelerator tube 142b) they may get accelerated within the accelerator tubes, resulting in a mass contamination to the high-energy ion beam 105a.

In addition, when ions from the ion beam 105 collide with the gas particles inside an accelerator tube (e.g., either the low-energy accelerator tube 142a and/or the high-energy accelerator tube 142b) the amount of energy added to the ion beam by accelerating the ions in the low-energy accelerator tube 142a and/or the high-energy accelerator tube 142b may be reduced. As an example, suppose that ions in the ion beam 105 collide with gas particles that leaked from the stripper tube 212 into the low-energy accelerator tube 142a, the ions in the ion beam 105 are negatively charged as they enter the low-energy accelerator tube 142a. As such, the ions are accelerated due to the voltage potential between the ends of the low-energy accelerator tube 142a. More specifically, the negatively charged ions are attracted to the positively charged end of the low-energy accelerator tube 142a, which is disposed proximate to the stripper tube 212. As such, the negatively charged ions are accelerated as they travel towards the stripper tube 212. However, if the negatively charged ions are converted to positively charged ions (e.g., by colliding with gas particles that leaked from the stripper tube 212 and being stripped of electrons) inside the low-energy accelerator tube 142a, the amount the ions will be accelerated is reduced. As such, the increase in energy of the ion beam 105 is consequently reduced.

A reduction in energy of the high-energy ion beam 105a due to the gas particles colliding with the beam outside the stripper tube is generally referred to herein as "energy contamination." This energy contamination may reduce the energy of the high-energy ion beam 105a sufficiently such that devices fabricated with the high-energy ion implanter system 100 may be adversely affected. More specifically, as the energy of the high-energy ion beam 105a is reduced, the focusing forces become too strong and as such, the trajectories of the ions in the high-energy ion beam 105a may be unpredictable.

The tandem accelerator 140 further includes a controller 218 operably connected to the gas pump 215 and the coolant pump 217. The controller 218 is further connected to a sensor 219 disposed inside the stripper tube 212. It is to be appreciated, that the controller 218 may be implemented using a variety of different technologies. For example, the controller may be software and/or firmware executable by a processor (not shown). As another example, the controller 218 may be an application specific integrated circuit, a field programmable gate array, or another type of programmable integrated circuit. With some examples, the controller 218 may be included with the cold stripper 144. In some examples, the controller 218 may be included as part of the overall control circuitry and/or software of the high-energy ion implanter system 100. Examples are not limited in this context.

In some examples, the sensor 219 may be a pressure sensor. The controller 218 may be configured to control the gas pump 215 and/or the coolant pump 217 such that the pressure within the stripper tube 212 is maintained within a specified limit. The controller 218 may receive signals from the sensor 219 indicating a pressure within the stripper tube 212. Based on the received signals, the controller 218 may increase or decrease the rate of coolant flow into the stripper tube 212 by controlling the coolant pump 217. Additionally, based on the received signals, the controller 218 may increase or decrease the rate of gas flow into the stripper tube 212 by controlling the gas pump 215. With some examples, the controller 218 may control the coolant flow and/or the gas flow to maintain the pressure within the stripper tube at a value between 0.000001 and 0.00008 Torr.

In some examples, the sensor 219 may be a temperature sensor. The controller 218 may be configured to control the coolant pump 217 such that the temperature within the stripper tube 212 is maintained within a specified limit. The controller 218 may receive signals from the sensor 219 indicating a temperature within the stripper tube 212. Based on the received signals, the controller 218 may increase or decrease the rate of coolant flow into the stripper tube 212 by controlling the coolant pump 217. The controller 218 may control the coolant flow to maintain the temperature in the stripper tube within a range of temperatures as described above. In some examples, the sensor 219 may be a combination pressure and temperature sensor. The controller 218 may be configured to control the gas pump 215 and/or the coolant pump 217 such that the temperature and/or pressure within the stripper tube 212 is maintained within specified limits.

Figure 3:
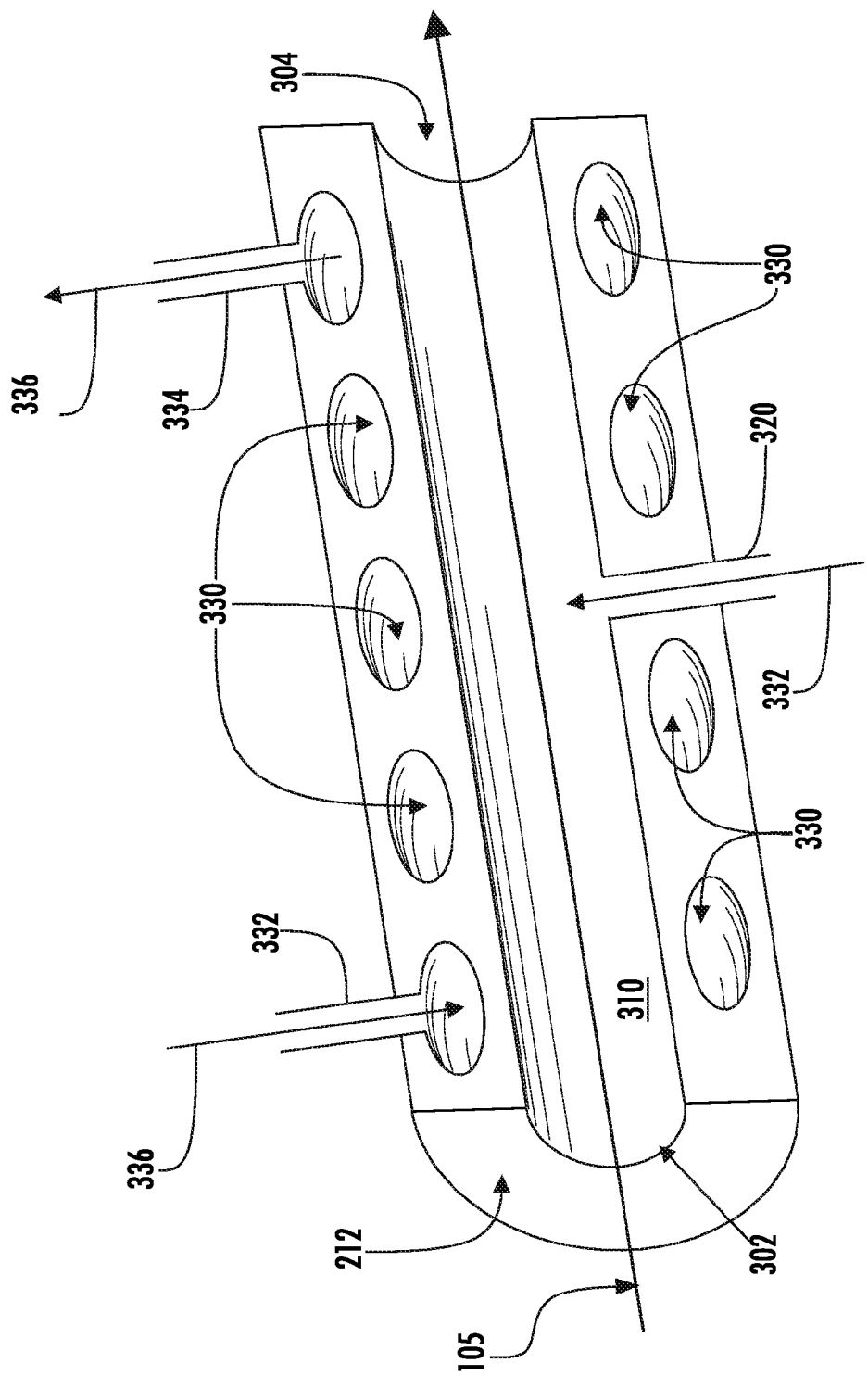
FIG. 3 depicts a view of a stripper tube.

FIG. 3 illustrates a perspective cut-away view of an exemplary embodiment of the stripper tube 212 with the ion beam 105 passing therethrough. It is to be appreciated, that the view depicted in this figure is not to scale. Furthermore, the stripper tube 212 depicted in this figure is discussed with reference to the tandem accelerator 140 of FIG. 2 and the high-energy ion implanter system 100 of FIG. 1. However, examples are not limited in this context. As depicted, the stripper tube 212 includes a hollow cavity 310, a first aperture 302, and a second aperture 304. The first aperture 302 and the second aperture 304 are configured to admit ions from the ion beam 105 and discharge ions, respectively. Said differently, during operation, the ion beam 105 may enter the stripper tube 212 through the first aperture 302, pass through the hollow cavity 310 and exit the stripper tube 212 through the second aperture 304. In some examples, the stripper tube 212 may be composed of graphite, tungsten, molybdenum, or another suitable material. In some examples, the first aperture and/or the second aperture may have a diameter between 5 and 30 mm. With some examples, the stripper tube 212 may have a length between 150 and 750 mm.

The stripper tube 212 includes a gas port 320. The gas pump 215 (refer to FIG. 2) may be coupled to the gas port 320 to introduce gas 322 into the hollow cavity 310. As described above, the gas 322 is introduced so that as the ion beam 105 (refer to FIGS. 1-2) passes through the stripper tube 212 the ions in the ion beam 105 will collide with the particles of the gas 322 and be stripped of electrons. Said differently, the ions in the ion beam 105 may be changed from having a negative charge to having a positive charge.

The stripper tube further includes coolant passages 330, a coolant inlet port 332, and a coolant output port 334. The coolant pump (refer to FIG. 2) may be coupled to the coolant inlet port 332 (or in some examples, the coolant output port 334) to circulate coolant 336 throughout the coolant passages 330. It is to be appreciated, that a variety of different configurations of coolant passages 330 may be implemented. As depicted, the coolant passages 330 are annular passages. However, it is to be appreciated, that other configurations are possible.

Figure 4:
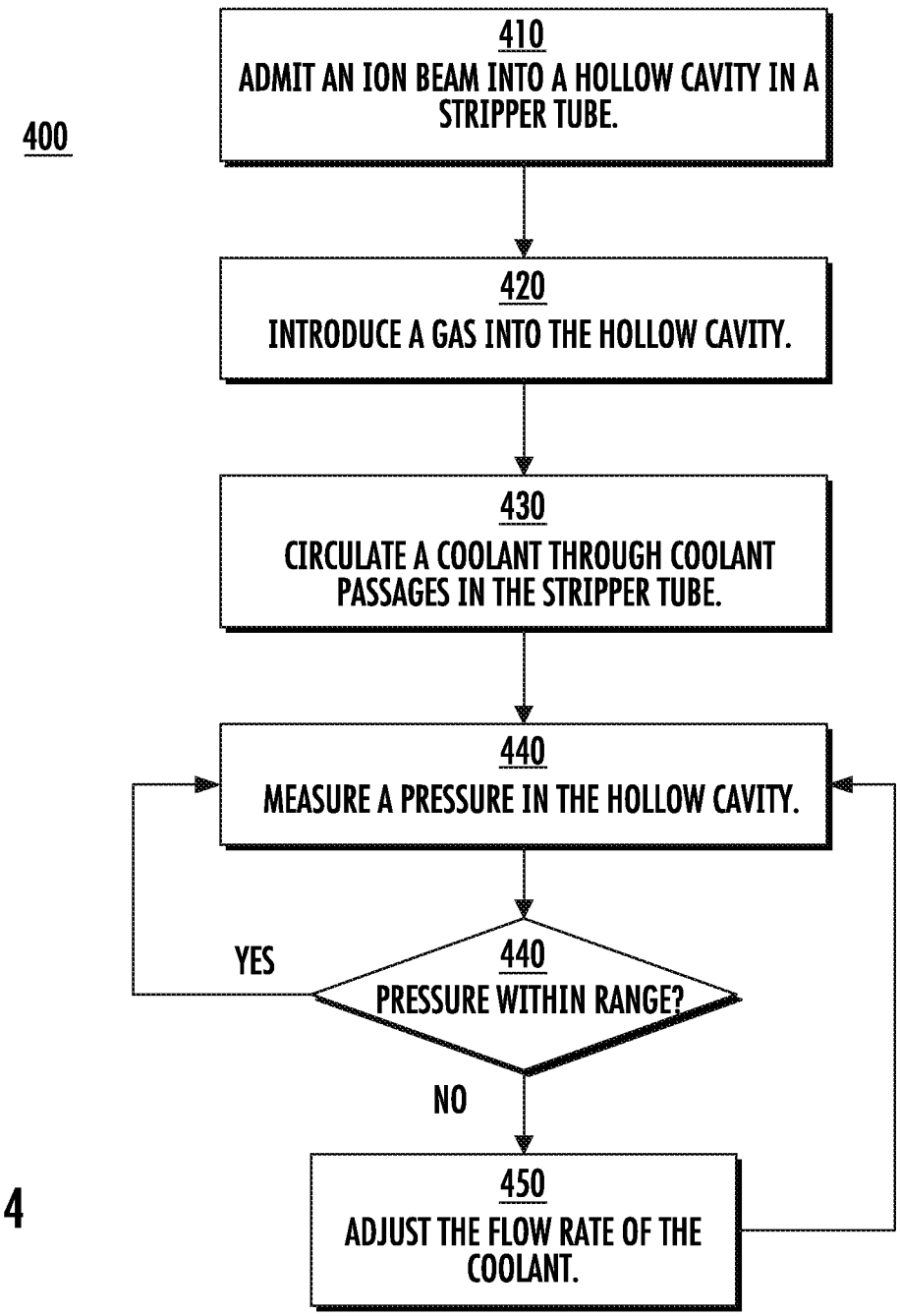
FIG. 4 depicts a flow diagram of a method of stripping electrons from an ion beam, all arranged according to at least one embodiment of the present disclosure.

FIG. 4 illustrates a flow chart for a method 400 that may be implemented in a high-energy ion implanter. For example, the method 400 may be implemented in the high-energy ion implanter system 100 described above. Although the method 400 is described with refer to the high-energy ion implanter system of FIG. 1 and particularly the cold stripper 144 discussed in FIGS. 2-3, examples are not limited in this context.

The method 400 may begin at block 410. At block 410, admit an ion beam into a hollow cavity in a stripper tube, the ion beam 105 may be admitted into the hollow cavity 310 of the stripper tube 212. Continuing to block 420, introduce a gas into the hollow cavity, the gas 322 may be introduced into the hollow cavity 310. Continuing to block 430, circulate a coolant through coolant passages, the coolant 336 may be circulated through the coolant passages 330 of the stripper tube 212. Continuing to block 440, measure a pressure inside the hollow cavity, the controller 218 may measure a pressure inside the hollow cavity using the sensor 219.

At block 440, it may be determined if the pressure is within a specified range of pressures. For example, it may be determined if the pressure is between 0.00005 and 0.00015 Torr. If the pressure is within the specified range, the method may return to block 430 and the coolant may be circulated through the cooling passages at the present flow rate. If the pressure is outside the specified range, the method may proceed to block 450, adjust the flow rate of the coolant. At block 450, the controller 218 may adjust the flow rate by controlling the coolant pump 217. For example, if the pressure if higher than the specified range, the coolant flow rate may be increased. If the pressure is below the specified range, the coolant flow rate may be reduced.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below should be construed in view of the full breadth and spirit of the present disclosure as described herein.

What is claimed is:

1. A cold stripper to strip electrons from ions in an ion beam comprising:
    a stripper tube having a hollow cavity;
    the stripper tube further comprising: a first aperture to admit an ion beam having negatively charged ions into the hollow cavity, a second aperture in the stripper tube to discharge the ion beam having positively charged ions from the hollow cavity, and a wall containing a coolant passage, the coolant passage disposed outside of the hollow cavity;

a gas pump coupled to the hollow cavity to introduce a gas into the hollow cavity;

a coolant passage in the stripper tube and disposed outside of the hollow cavity; and a coolant pump coupled to the cooling passage to circulate a coolant through the cooling passage.

2. The cold stripper of claim 1, wherein the cold stripper is disposed between a low-energy accelerator tube of a tandem accelerator and a high-energy accelerator tube of the tandem accelerator.

3. The cold stripper of claim 1, wherein the cooling passage comprises one or more cooling passages which are annular passages formed around the hollow cavity.

4. The cold stripper of claim 1, wherein the stripper tube is composed of a material selected from the group consisting of graphite, molybdenum, and tungsten.

5. The cold stripper of claim 1, further comprising a controller operably connected to the coolant pump to control a flow of the coolant.

6. The cold stripper of claim 5, further comprising a temperature sensor disposed in the stripper tube, the controller operably connected to the temperature sensor and configured to adjust the flow of the coolant to maintain a temperature of the stripper tube.

7. The cold stripper of claim 5, further comprising a pressure sensor disposed in the hollow cavity, the controller operably connected to the pressure sensor and configured to adjust the flow of the coolant to maintain the pressure in the hollow cavity between a range of pressures.

8. The cold stripper of claim 5, the controller further operably connected to the gas pump to control a flow of gas into the hollow cavity, the cold stripper further comprising a pressure sensor disposed in the hollow cavity, the controller operably connected to the pressure sensor and configured to adjust the flow of gas and the flow of coolant to maintain a pressure within the hollow cavity between a range of pressures.

9. The cold stripper of claim 8, wherein the range of pressures is 0.000001 and 0.00008 Torr.

10. A tandem accelerator used to accelerate ions in an ion beam comprising:
   a low-energy accelerator tube
   a high-energy accelerator tube; and
   a cold stripper disposed between the low-energy accelerator tube and the high-energy accelerator tube, the cold stripper comprising:
      a stripper tube including a hollow cavity;
      the stripper tube further comprising a first aperture to admit an ion beam having negatively charged ions into the hollow cavity, a second aperture to discharge the ion beam having positively charged ions from the hollow cavity, and a wall containing coolant passage, the coolant passage disposed outside of the hollow cavity;
      a gas pump coupled to the hollow cavity to introduce a gas into the hollow cavity;
      a cooling passage disposed in the stripper tube and disposed outside of the hollow cavity; and
      a coolant pump coupled to the cooling passage to circulate a coolant therethrough.

11. The tandem accelerator of claim 10, wherein the cooling passage comprises a plurality of annular cooling passages formed around the hollow cavity.

12. The tandem accelerator of claim 10, wherein the stripper tube is composed of a material selected from the group consisting of graphite, molybdenum, or tungsten.

13. The tandem accelerator of claim 10, further comprising a controller operably connected to the coolant pump to control a flow of the coolant.

14. The tandem accelerator of claim 13, further comprising a temperature sensor disposed in the stripper tube, the controller operably connected to the temperature sensor and configured to adjust the flow of the coolant to maintain the temperature of the stripper tube between a range of temperatures.

15. The tandem accelerator of claim 13, further comprising a pressure sensor disposed in the hollow cavity, the controller operably connected to the pressure sensor and configured to adjust the flow of the coolant to maintain the pressure in the hollow cavity between a range of pressures.

16. The tandem accelerator of claim 13, the controller further operably connected to the gas pump to control a flow of gas into the hollow cavity, the cold stripper further comprising a pressure sensor disposed in the hollow cavity, the controller operably connected to the pressure sensor and configured to adjust the flow of gas and the flow of coolant to maintain the pressure within the hollow cavity between the range of pressures.

17. A method of generating a high-energy ion beam comprising:
   admitting an ion beam into a hollow cavity in a stripper tube, wherein the stripper tube comprises a wall containing one or more coolant passages, the one or more coolant passages disposed around the hollow cavity and outside of the hollow cavity;
   introducing a gas into the hollow cavity;
   cooling the stripper tube;
   measuring a pressure in the hollow cavity; and
   adjusting a rate of the cooling to maintain the pressure in the hollow cavity between a range of pressures.

18. The method of claim 17, further comprising circulating a coolant through the one or more cooling passages to maintain a temperature of the stripper tube between a range of temperatures.

19. The method of claim 18, further comprising:
   measuring the temperature of the hollow cavity; and
   adjusting a flow of the circulating coolant through the one or more passages to maintain the temperature of the stripper tube between the range of temperatures.

* * * * *